US006971756B2

(12) United States Patent
Vasylyev et al.

(10) Patent No.: US 6,971,756 B2
(45) Date of Patent: Dec. 6, 2005

(54) APPARATUS FOR COLLECTING AND CONVERTING RADIANT ENERGY

(75) Inventors: Sergiy Victorovich Vasylyev, Davis, CA (US); Viktor Petrovych Vasylyev, Kharvkov (UA)

(73) Assignee: SVV Technology Innovations, Inc., Elk Grove, CA (US)

(*) Notice: Subject to any disclaimer, the term of this patent is extended or adjusted under 35 U.S.C. 154(b) by 4 days.

(21) Appl. No.: 10/026,121

(22) Filed: Dec. 17, 2001

(65) Prior Publication Data

US 2002/0075579 A1 Jun. 20, 2002

Related U.S. Application Data

(60) Provisional application No. 60/255,702, filed on Dec. 18, 2000.

(51) Int. Cl.[7] .............................. G02B 5/10; F24J 2/10
(52) U.S. Cl. ....................... 359/852; 359/853; 126/692
(58) Field of Search ................................ 359/851, 852, 359/853, 596, 597; 126/684, 692, 693, 694, 126/695, 683, 688, 689, 690, 691, 696; 136/246

(56) References Cited

U.S. PATENT DOCUMENTS 3,058,394 A 10/1962 Edlin
3,884,217 A * 5/1975 Wartes ........................ 126/571
RE30,027 E * 6/1979 Hockman ................... 126/270
4,220,137 A * 9/1980 Tesch et al. ................ 126/702
4,258,702 A * 3/1981 Harrison ..................... 126/702
4,312,329 A 1/1982 Carver et al.
4,337,759 A * 7/1982 Popovich et al. ........... 126/684
4,347,834 A * 9/1982 York .......................... 126/602
4,440,155 A 4/1984 Maloof et al.
4,520,794 A 6/1985 Stark et al.
5,180,441 A 1/1993 Cornwall et al.
5,295,051 A * 3/1994 Cowling ..................... 362/576
5,344,497 A 9/1994 Fraas et al.
5,802,784 A * 9/1998 Federmann ................ 52/204.5
5,982,562 A 11/1999 Rode
6,473,554 B1 * 10/2002 Pelka et al. ................. 385/146

FOREIGN PATENT DOCUMENTS

SU 1023270 A 1/1982

OTHER PUBLICATIONS

Viktor Vasylyev, Sergiy Vasylyev, and Yury Tkach, A Novel Prospective Type of Solar Optics Configurations for High-Heat Minefield Clearing, World Renewable Energy Congress V, Renewable Energy, 1998, A.A.M. Sayigh, ed., Part IV, p. 2344-2347.

* cited by examiner

*Primary Examiner*—Mark A. Robinson
(74) *Attorney, Agent, or Firm*—John P. O'Banion

(57) ABSTRACT

A radiant energy collecting and converting device having at least one array of slat-like concave reflective elements and an elongated receiver. The device efficiently concentrates and converts radiant energy, such as sunlight, to other useful types of energy, such as electricity and heat. The mirrored surfaces of reflective elements having appropriate individual profiles represented by curved and/or straight lines are positioned so that the energy portions reflected from individual surfaces are directed, focused, and superimposed on one another to cooperatively form a common focal region on the receiver. The mirrored surfaces are inclined towards one another at their rear ends facing the receiver and can be arranged to provide lens-like operation of the array. The receiver can be arranged in line photovoltaic cells or a tubular solar heat absorber.

19 Claims, 4 Drawing Sheets

APPARATUS FOR COLLECTING AND CONVERTING RADIANT ENERGY

CROSS-REFERENCE TO RELATED APPLICATIONS

This application claims the benefit of prior U.S. Provisional Patent Application Ser. No. 60/255,702 filed Dec. 18, 2000.

BACKGROUND OF THE INVENTION

1. Field of the Invention

The present invention generally relates to a device for collecting and converting radiant energy to whatever useful type of energy. In particular, this invention relates to solar energy systems for generating heat and/or electricity using a line-focus sunlight concentrator and an elongated receiver.

2. Description of Prior Art

In the past radiant energy concentrating devices have been used in space and on Earth to generate heat and electrical current from a light source such as the sun. However, because of the costs associated with capturing the sunlight in a widely useful form, solar energy has not approached its potential for becoming an important source of power. In particular, it is expensive in terms of capital cost to convert solar energy into electricity, substantially based on the complex manufacturing process involved in making efficient, high-precision solar concentrators with large apertures.

Systems are known for the generation of electrical power through the conversion of solar energy concentrated by a suitable refractor, such as a line-focus Fresnel lens, or a reflector, such as a parabolic trough system.

An approach is known where Fresnel lenses are used to collect and focus sunlight onto a narrow-strip photovoltaic array. These lenses are typically made of transparent acrylic sheets or optically clear silicone rubber materials. Glass materials can also be employed to provide structural strength of the design.

Despite the obvious advantages of the Fresnel lens, such as operational convenience due to forming the focal region on the concentrator's back side, this approach still has no less obvious shortcomings.

The refraction index of plastic materials is essentially limited thus restricting concentration power of line-focusing lenses. Prior art refractive lenses are generally bulky and fragile, complicating their manufacturing and use. The use of glass increases the weight, cost, and damage vulnerability of the lens. Furthermore, transparent refractive materials are known to degrade over time, due to interacting with chemicals and ultraviolet radiation.

Parabolic trough concentrators having much more concentrating power are implemented, for example, in so-called SEGS plants (Solar Energy Generating Systems) in California. These prior art concentrators use parabolic cylinder mirrors made of silvered composite glass to focus sunlight onto tubular solar energy receivers.

The parabolic troughs require extremely accurate continuous reflective surfaces of a very large aperture to achieve acceptably high concentration of the solar energy. Thus the prior art parabolic trough systems are expensive and heavy, due to the requirements of high optical accuracy. Continuous-surface parabolic mirrors are also not readily adaptable to provide a desired irradiance distribution for the receiver/absorber.

In the past, a lot of efforts have been made to simplify the parabolic trough concentrators and lower the costs for a solar power system. In particular, sheets of anodized aluminum and polymer films have been used for reflective surfaces of troughs. It has been a disadvantage, however, that these thinner mirrors do not have the self-supportive properties of composite glass and require sophisticated support structures to maintain their parabolic shape.

Furthermore, it has been a general disadvantage of all conventional retroreflecting devices that operational convenience and use of larger absorbers/accessories or secondary concentrating optics disposed on the path of incoming energy are essentially limited due to unavoidable shadowing of the incident flux.

In the past, various arrangements of reflective slat-like lenses for concentrating radiant energy have been tried. As disclosed in U.S. Pat. No. 5,982,562, issued Nov. 9, 1999, in one embodiment, the trough lens suitable for directing radiation can be formed by an array of reflectors arranged so that each reflector is a planar slat. These lenses, however, are unsatisfactory for high-performance energy collection since the individual planar slats are redirecting the energy without focusing so that the geometric concentration ratio produced by the lens is relatively low.

At the time of writing, none of known one-stage reflective concentrators provides efficient sunlight concentration to a linear absorber disposed on the concentrator's backside.

BRIEF SUMMARY OF THE INVENTION

In accordance with the present invention, the prior art problems are solved by an apparatus for collecting and converting radiant energy comprising a plurality of incorporated in at least one array slat-like reflective surfaces extending between generally parallel front and rear opposing longitudinal ends and having generally concave transversal profiles, and an elongated energy receiving means disposed in energy receiving relation to each of said reflective surfaces. The reflective surfaces are designed and positioned to concentrate and direct the radiant energy toward a plurality of converging directions to form a common linear focal region on the energy receiving means based on the superposition of concentrated energy fluxes reflected from individual reflective surfaces. The energy receiving means is used for receiving and converting the radiant energy to whatever useful type of energy.

According to one aspect of the invention, in a preferred embodiment, there is provided an apparatus for collecting and converting radiant energy in which reflective surfaces are designed and positioned to minimize screening and shadowing on other reflective surfaces.

According to another aspect of the invention there is provided an apparatus for collecting and converting radiant energy in which reflective surfaces have concave profiles represented by simple or compound segments of conical sections having parabolic, hyperbolic, circular, or elliptical shape. Furthermore, one or more reflective surfaces can be planar or have a profile represented by a set of straight lines approximating a curved shape. In addition, the profiles of reflective surfaces can be represented by segments of parametric curves or splines tailored to provide a desired illumination of the energy receiving means.

According to further aspect of the invention there is provided an apparatus for collecting and converting sunlight to heat and/or electricity. The energy receiving means can be a fluid-carrying tubular absorber of solar heat collector, or a plurality of arranged in line photovoltaic solar cells for generating electricity, which may have a heat sink for heat extraction. The energy receiving means can be positioned so that its working area will be facing toward both the array of reflective surfaces and the source of radiant energy. The apparatus can further comprise at least one axle support for tracking the movement of the sun.

According to a further aspect of the invention there is provided an apparatus for collecting and converting radiant energy in which the energy receiving means can be mechanically separated from the reflective surfaces.

Moreover, according to an embodiment of the invention, there is provided an apparatus for collecting and converting radiant energy in which one or more reflective surfaces is disposed in any one of a translated, a reversed and/or a rotated orientation relative to the others having the same basic arrangement.

OBJECTS AND ADVANTAGES OF THE INVENTION

The present invention is believed to overcome the shortcomings of the previously known systems employing parabolic troughs and linear Fresnel lenses as primary concentrators.

Accordingly, one of the key objects and advantages of this invention is to provide improved energy collection and conversion apparatus, said apparatus uniquely combining Fresnel lens-like operation and dramatically improved concentration power and adaptability as compared to prior art systems employing line-focus refractors and reflectors.

Another object in accordance with the apparatus of the invention is to enhance concentration of radiant energy and conversion of said energy to whatever useful type of energy. The invention can be essentially useful and greatly superior over conventional devices for solar energy applications by providing an improved device for converting the sunlight to heat and/or electricity so that the cost for use of solar energy is reduced.

Additional objects and advantages of the present invention will be apparent to persons skilled in the art from a study of the following description and the accompanying drawings, which are hereby incorporated in and constitute a part of this specification.

DRAWING FIGURES

DETAILED DESCRIPTION OF THE INVENTION

The embodiments of energy collecting systems selected for the purpose of illustrating the invention include a concentrator and a receiver.

Figure 1:
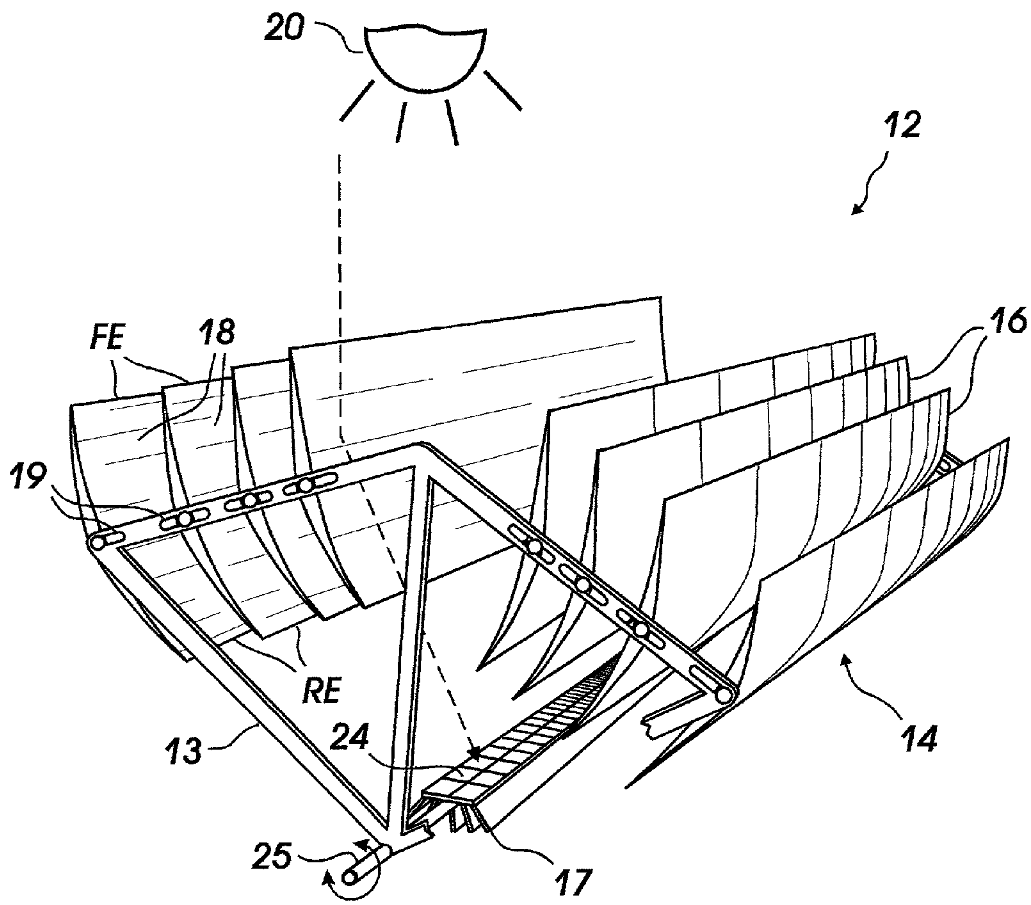
FIG. 1 is a perspective view of an apparatus for collecting and converting radiant energy in accordance with a preferred embodiment of the present invention.

FIG. 1 shows in general an apparatus 12 for collecting and converting radiant energy according to a preferred embodiment. Apparatus 12 includes an energy concentrator 14 comprising a plurality of slat-like elongated concave reflective elements 16 having parallel longitudinal axes, and an elongated receiver 24 extending parallel to each reflective element 16. Elements 16 are incorporated in two symmetric arrays where elements 16 are spaced apart and positioned adjacent to each other in a stepped arrangement, so that concentrator 14 has a linear, Venetian blind-like configuration.

Elements 16 have mirrored surfaces 18 which receive radiant energy from an energy source 20 and reflect that energy downward to receiver 24. Each reflective surface is extending between front and rear opposing longitudinal ends. For example, front and rear ends for two uttermost reflective surfaces 18 are respectively indicated as FE and RE in FIG. 1. Mirrored surfaces 18 are individually curved and arranged so that their ends facing receiver 24 are inclined towards one another to provide the reflection of incident energy from respective surfaces 18 to a plurality of convergent directions. Surfaces 18 are positioned so that the reflected and concentrated energy portions are focused and superimposed on one another to form a common focal region on a side of concentrator 14 generally opposite the side of energy source 20 and relatively remote from surfaces 18. Reflective elements should preferably be designed and positioned so as to minimize screening and shadowing on other elements for both incident and concentrated energy fluxes.

Receiver 24 is disposed in the focal region cooperatively formed by surfaces 18 to intercept and convert the concentrated radiant energy to whatever useful type of energy. Receiver 24 should be adapted to absorb whatever type of energy apparatus 12 is used to collect and convert. For example, as shown in FIG. 1, when apparatus 12 is used to collect and convert solar energy, receiver 24 can be a an elongated photovoltaic solar panel for generating electricity, which may have a heat sink 17 for heat extraction.

Figure 2A:
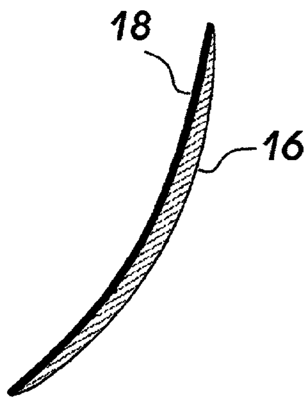
FIG. 2A is a cross-sectional schematic view of a reflecting slat of the apparatus shown in FIG. 1.
Figure 2B:
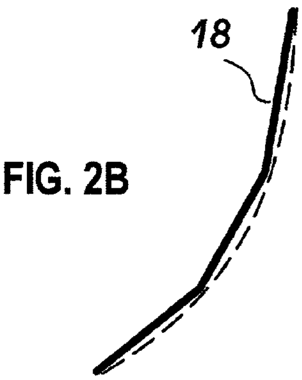
FIG. 2B is a schematic view of a segmented mirrored surface profile.

FIG. 2A depicts a cross-sectional view of a reflecting element 16. Each of the reflective elements 16 has a curved mirrored surface 18, which can be parabolic or circular in the cross section. Alternatively, mirrored surface 18 can have a profile which is a composite or combination of conjugate curved or planar segments. For example, FIG. 2B shows, a curved profile of mirrored surface 18 may be divided into two or more adjacent planar segments disposed at an angle to each other in which the planar segments approximate a curved line (indicated by a dashed line).

Reflective elements 16 can easily be fabricated using a number of means and materials. For example, elements 16 can be made of metal through extrusion of a metal part, roll-forming from a sheet, slip rolling, pressing, moulding, machining, and electroforming, and then polished on the reflecting side to obtain the required specular reflectivity for mirrored surface 18. In an alternative example, plastic compound materials can be used for fabricating elements 16 and a foil or non-metal aluminized or silvered film, such as Mylar, Kapton or Lucite, can be used as a reflective material for mirrored surfaces 18.

Reflective elements 16 can be mounted or secured to a frame in any suitable manner. For example, a frame may be provided which comprises bands 13 of metal, plastic, wood or other material extending transversely of the reflective element longitudinal axes at the element ends to support reflective elements 16 and receiver 24, as shown in FIG. 1. Suitable frame members (not shown) may interconnect the bands. Since elements 16 are separated, there are spaces for rain water to drain and which also improve the wind resistance of concentrator 14. Reflective elements 16 may be secured to bands 13 by individual brackets or slots 19 in bands 13 to facilitate possible replacement and/or adjustment of individual elements 16.

Figure 3:
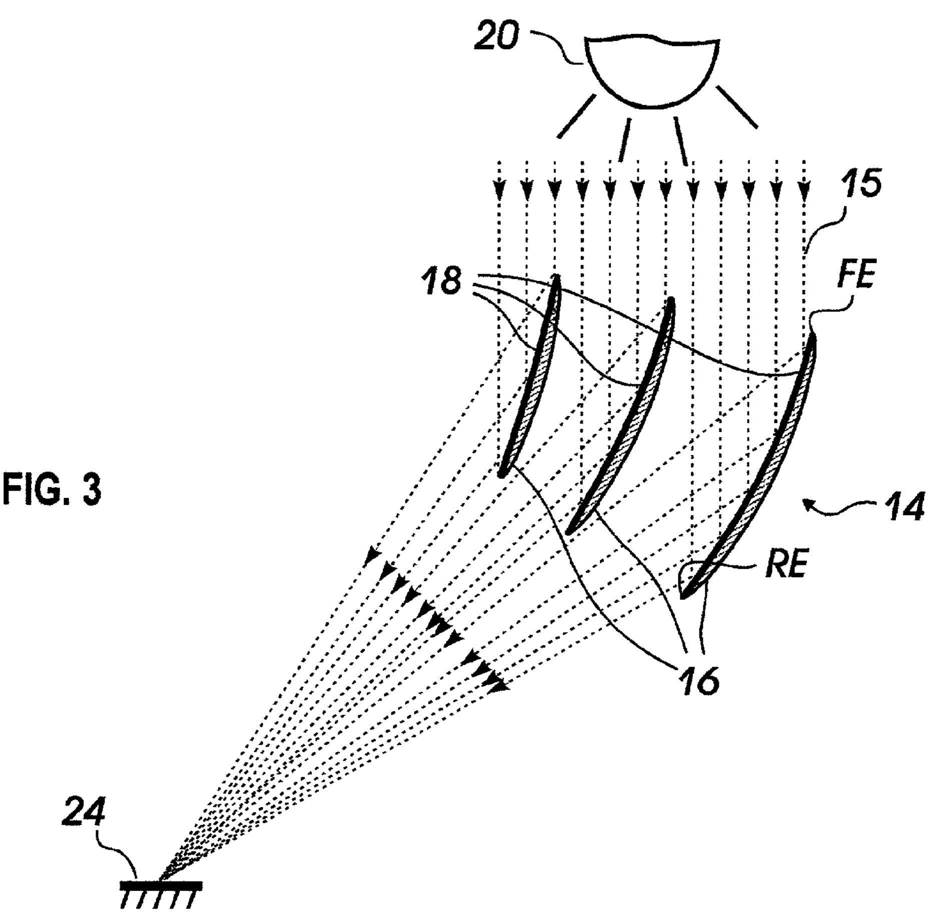
FIGS. 3 and 4 are schematic diagrams illustrating the energy collecting principles in accordance with an embodiment of the invention.
Figure 4:
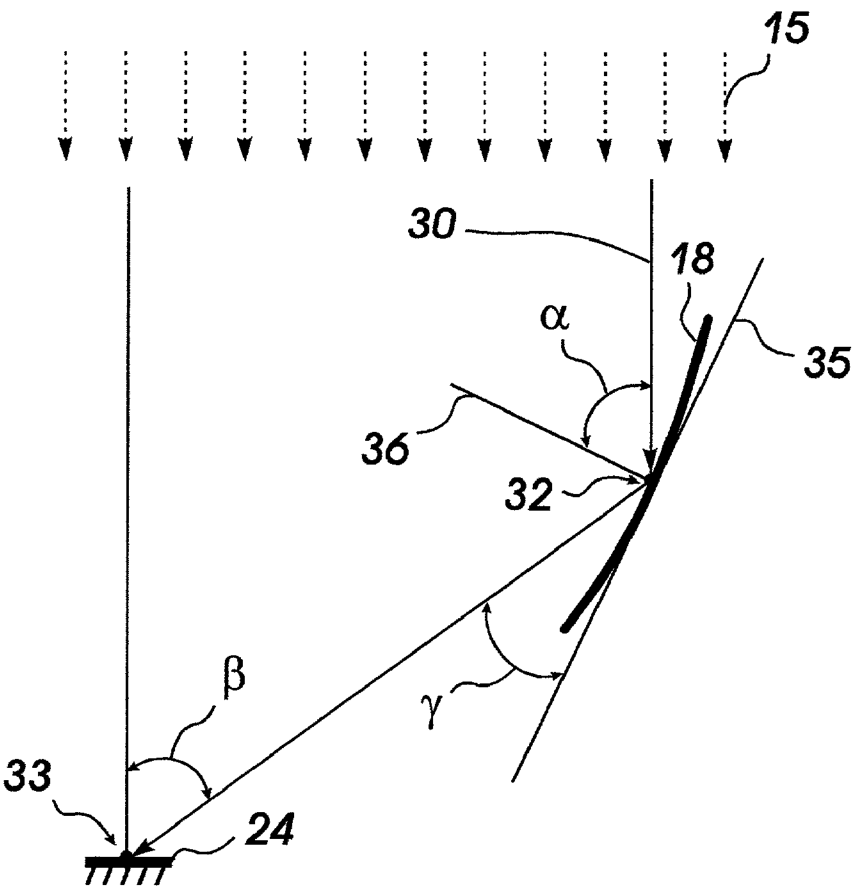

FIGS. 3 and 4 more fully illustrate operation of apparatus 12 as a solar collector. Only three adjacent elements 16 are shown in FIG. 3 for the purpose of clarity. However, it should be understood that apparatus 12 can incorporate any convenient number of reflective elements 16, limited only by the desired optical and dimensional parameters of concentrator 14. Referring to FIG. 3, sunlight 15 (represented by parallel dotted lines) strikes reflective elements 16 and is reflected by mirrored surfaces 18 to receiver 24, where concentrated beams formed by individual reflective elements 16 are superimposed on one another and absorbed by receiver 24. As shown in FIG. 3, reflective surfaces 18 are inclined by their rear ends RE towards one another, and rear ends RE are facing receiver 24 to insure lens-like operation. The individual slopes and curvatures for each mirrored surface 18 are selected so that reflective elements 16 form their concentrated energy beams are centered relatively to each other on the active surface of receiver 24.

As can be seen from FIG. 3, surfaces 18 form convergent energy beams and direct those beams by means of a single reflection toward receiver 24 through spaces between the rear ends of adjacent surfaces. Screening and shadowing on adjacent elements 16 can be minimized or eliminated by aligning the front end of inner surface 18 and the rear end of adjacent outer surface 18 relatively to each other with respect to the incident flux, and disposing the rear end of the inner surface 18 out of the path of energy rays reflected from the front end of the outer surface 18.

FIG. 4 shows a concave profile of a single mirrored surface 18. A sunlight ray 30 strikes a point 32 of surface 18. The slope of surface 18 at point 32 is such that ray 30 is reflected to a point 33 of receiver 24. The concave profile of surface 18 has tangent 35 and normal 36 at point 32. It will be appreciated that angle $\alpha$ is the angle of incidence between ray 30 and normal 36. As a matter of optics, the angle of incidence $\alpha$ equals the angle of reflection.

Accordingly, angle $\gamma$, which is the angle between tangent 35 and direction to point 33 taken at point 32, equals $90°—\alpha$. It follows, then, as a matter of geometry, that angle $\beta$, which is the angle between the direction to the sun and direction to point 32 taken at point 33, equals $180°—2\alpha$. Angle $\beta$ should preferably be less than 90° for all points of surfaces 18 to provide skew reflection and energy concentration below concentrator 14, as illustrated in FIG. 3. Angles $\alpha$ and $\gamma$ should thereby be in a relationships $\alpha>45°$ and $\gamma<45°$ in accordance with a preferred embodiment.

According to a preferred embodiment, if apparatus 12 is used to collect and convert solar energy, it is typically oriented with its longitudinal axis in the East-West direction and can be made adjustable on a seasonal basis. As shown in FIG. 1, an axle support 25 mechanically connected to reflective elements 16 and receiver 24 can be provided to facilitate tracking of the sun, so that an optimum concentration of radiation is reflected on to receiver 24.

Alternatively, the longitudinal axis of apparatus 12 can be oriented in the South-North direction and can be provided with East-West tracking at approximately 15° an hour. Furthermore, a conventional two-axis support can be provided to facilitate more precise tracking of the sun.

Other Embodiments

The foregoing embodiments are described upon the case when reflective elements 16 have fixed positions relatively to each other. However, this invention is not only limited to this, but can be applied to the case where elements 16 can be rotated around their longitudinal axes and/or moved relatively to each other and receiver 24. This can be useful, for example, for tracking/following the radiant energy source 20 or adaptation of concentrator 14 to a specific shape of receiver 24.

Figure 5:
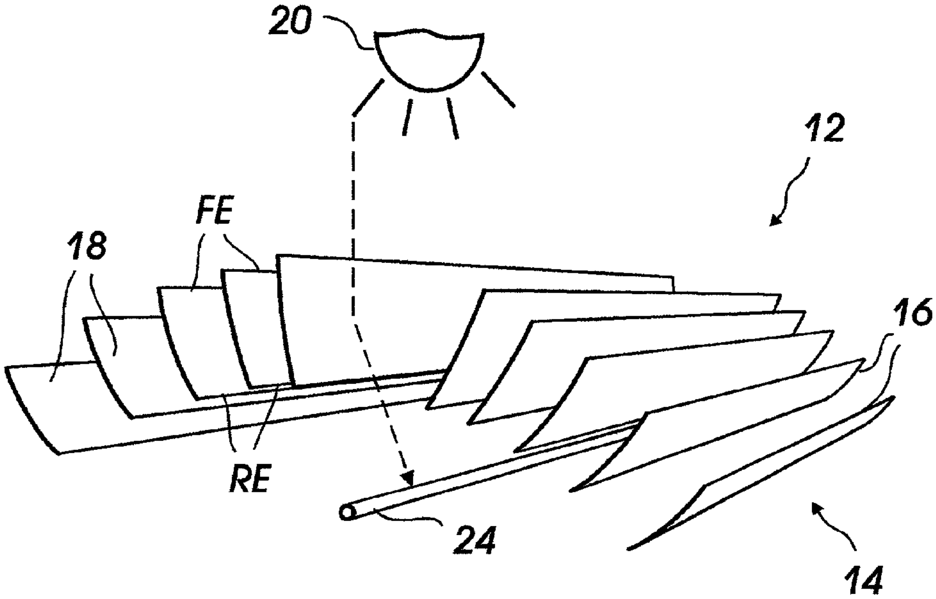
FIG. 5 is a schematic general view of the energy collecting and converting apparatus comprising a tubular absorber.

Referring now to FIG. 5, an additional embodiment of the invention is illustrated. As shown in FIG. 5, when apparatus 12 is used to collect and convert solar energy, reflective elements 16 can be disposed so that they surround receiver 24 which can be a fluid-carrying, black-painted copper tube for converting solar energy to heat. Alternatively, when apparatus 12 is used to collect microwaves, for example, receiver 24 can be convex, with a spherical contour, and made of a material suitable for absorbing microwaves.

In accordance with other embodiments, angle $\beta$ is not limited to be less than 90° for all points of surfaces 18 and can take values up to 180°, especially for receiver 24 having tubular shape.

Figure 6:
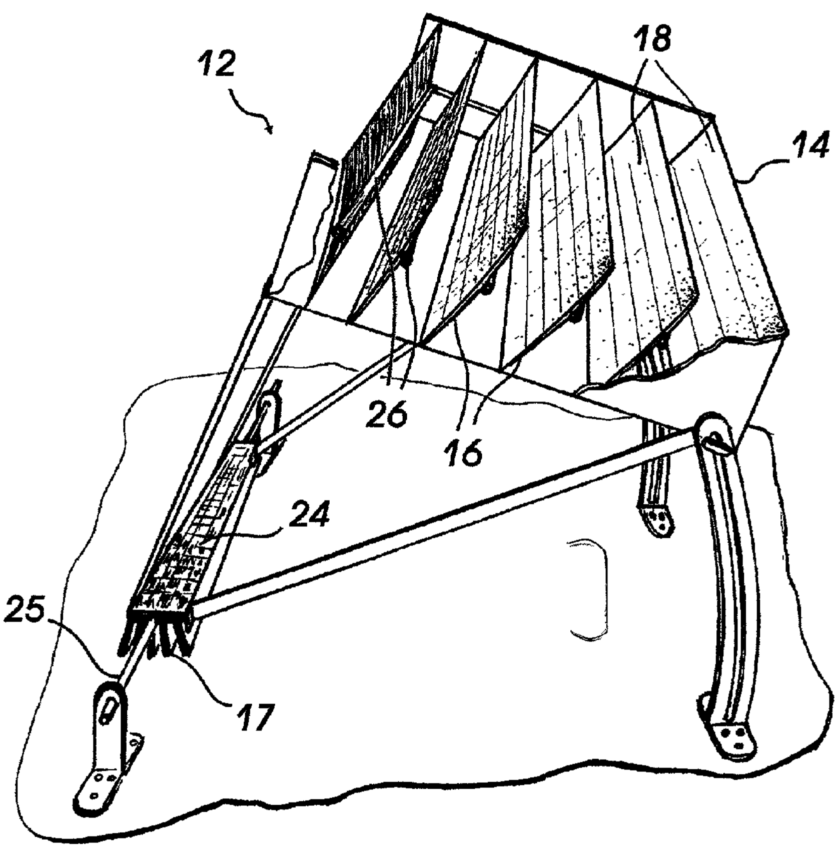
FIG. 6 is a perspective view of a further embodiment of the energy collecting and converting apparatus.

The foregoing embodiments are described upon the case when concentrator 14 comprises two symmetric arrays of elements 16 disposed at an angle to each other. Referring now to FIG. 6, a further modification of the invention is illustrated in which only one array is used (asymmetric design). Receiver 24 can be disposed in any rotated position around its longitudinal axis to provide optimum illumination by the array of reflective elements 16. Alternatively, reflective elements 16 can be organized in two or more arrays that can be tilted, rotated, and positioned differently relatively to each other and receiver 24.

In addition, this invention is not limited to the case where individual concentrated beams reflected from mirrored surfaces 18 of reflecting elements 16 are superimposed and centered relatively to each other on receiver 24. Instead, the dimensions, curvatures and relative dispositions of elements 16 and surfaces 18 can be varied so that the respective beams can be made partially overlapped, contacting, or spaced apart, for example, to provide uniform irradiance distribution on receiver 24.

There are also various other possibilities with regard to the dimensions, number and relative disposition of reflective elements 16, as well as individual curvatures of surfaces 18. In addition, one or more individual elements 16 can be selectively added, omitted, changed or replaced in concentrator 14 to provide the application-specific operation or desired dimensions.

As shown in FIG. 6, elements 16 can also comprise one or more tubular members 26 disposed in the shadow zones of the corresponding elements and containing circulating heat exchange fluid for heat extraction from concentrator 14 and improved energy utilization, and for additional structural strength.

As apparatus 12 can be built so that the concentrated energy beam is extended sufficiently far from reflective elements 16, and receiver 24 can be made mechanically separated from concentrator 14. By way of example, receiver 24 can be a conveyer band with a drying product.

Conclusion, Ramifications, and Scope

Accordingly, the reader will see that the apparatus of this invention can be used to collect and convert radiant energy to whatever useful type of energy easily and conveniently utilizing a simple but efficient one-stage concentrator coupled to an energy receiver.

Furthermore, the apparatus for energy collection and concentration has the additional advantages in that

- it allows for significantly better concentration ability as compared to traditional parabolic trough-based devices due to reduced aberrations on shorter segments of individual reflective elements acting as independent concentrators;
- it permits the improvement in specular reflectivity of the reflective materials and reduced requirements to concentrator's manufacturing tolerances due to implementing skew reflection (up to grazing incidence);
- it permits downward reflection and placement of the receiver on the concentrator's back side, that provides the ultimate operational convenience and virtually removes the restrictions on target/receiver size, shape and state, which are inherent to most conventional devices;
- it permits the manipulation by individual reflective elements to achieve different irradiation regimes for the receiver;
- it provides better wind and rain withstanding, as well as other constructional advantages, due to its non-monolithic structure.

Although the above description contains many specificities, these should not be construed as limiting the scope of the invention but are merely providing illustrations of some of the presently preferred embodiments of this invention. While a variety of embodiments have been disclosed, it will be readily apparent to those skilled in the art that numerous modifications and variations not mentioned above can still be made without departing from the spirit and scope of the invention.

What is claimed is:

1. An apparatus for collecting and converting radiant energy, comprising:

a plurality of spaced apart non-transparent linear reflective elements, said linear reflective elements incorporated in at least one array;

each said linear reflective element having longitudinal ends;

each said linear reflective element having a mirrored surface;

each said linear mirrored surface having a generally concave transversal profile;

wherein at least a substantial part of said mirrored surface of each said linear reflective element is designed and positioned to reflect incident radiant energy that impinges upon said mirrored surface into a convergent beam;

wherein said array of said linear reflective elements is configured to direct, by means of single stage specular reflection, convergent beams from said linear reflective elements to preselected converging directions through spaces between adjacent pairs of said linear reflective elements; and wherein said linear reflective elements are discrete elements which are unjoined along their longitudinal ends.

2. An apparatus as recited in claim 1, further comprising:

an elongated energy receiving means for receiving said convergent beams from said linear reflective elements, said energy receiving means disposed in energy receiving relation to each of said mirrored surfaces whereby convergent beams reflected from two or more adjacent mirrored surfaces at least partially superimpose on one another on said energy receiving means.

3. An apparatus as recited in claim 2, wherein said energy receiving means is positioned according to a relation: $\beta<90°$ where $\beta$ is an angle between the direction to the source of said radiant energy and direction to a point at said mirrored surfaces taken at a point of the energy receiving surface of said energy receiving means.

4. An apparatus as recited in claim 2, wherein said energy receiving means comprises at least one photovoltaic cell having a working area facing toward said mirrored surfaces and the source of said radiant energy.

5. An apparatus as recited in claim 4, further comprising at least one heat sink which is in heat exchange relation with said photovoltaic cell.

6. An apparatus as recited in claim 2, wherein said energy receiving means comprises at least one fluid-carrying tube of a solar heat collector.

7. An apparatus as recited in claim 2, wherein said energy receiving means is mechanically separated from said plurality of said reflective elements.

8. An apparatus as recited in claim 2, wherein said reflective elements ore arranged in two or more arrays that can be individually tilted, rotated, and positioned differently relatively to each other and said energy receiving means.

9. An apparatus as recited in claim 1, each said mirrored surfaced having a slope wherein angles of incidence $\alpha$ of said radiant energy on said mirrored surface are greater than 45° and less than 90°.

10. An apparatus as recited in claim 1, wherein one or more said reflective elements is disposed in any one of a translated, a reversed and/or a rotated orientation relatively to the others having the same basic arrangement.

11. An apparatus as recited in claim 1:

wherein said mirrored surfaces are designed and positioned to minimize screening and shadowing on other mirrored surfaces; and wherein a front end of an inner mirrored surface and a rear end of an adjacent outer mirrored surface are aligned relatively to each other with respect to incident flux; and wherein the rear end of said inner mirrored surface is disposed out of the path of energy rays reflected from the front end of said outer surface.

12. An apparatus as recited in claim 1, wherein at least one of said transversal profiles comprises a segment of conical section curve.

13. An apparatus as recited in claim 12, wherein said segment is parabolic.

14. An apparatus as recited in claim 12, wherein said segment is circular.

15. An apparatus as recited in claim 1, wherein at least one of said transversal profiles has a shape represented by a function selected from the group consisting of a polynomial function of at least second order, a parametric curve, and a spline tailored to provide a desired irradiance distribution on said energy receiving means.

16. An apparatus as recited in claim 1, wherein at least one of said transversal profiles comprises a set of conjugated lines selected from the group consisting of straight, parabolic, circular, elliptical, and hyperbolic segments.

17. An apparatus as recited in claim 1, further comprising at least one axle support means for positioning said at least one array of said reflective elements according to the movement of source of said radiant energy.

18. An apparatus as recited in claim 1, further comprising:

support means for supporting said plurality of said reflective elements;

said support means arranged so that said mirrored surfaces can be individually adjusted by rotating around their respective longitudinal axes and/or moving relatively to one another.

19. An apparatus as recited in claim 1, wherein at least one of the linear reflective elements comprises a composite of linear planar reflectors extending parallel to said mirrored surfaces and having a same basic orientation thereby forming said generally concave transversal profile.

* * * * *